United States Patent
Guerin et al.

(10) Patent No.: US 9,269,603 B2
(45) Date of Patent: Feb. 23, 2016

(54) TEMPORARY LIQUID THERMAL INTERFACE MATERIAL FOR SURFACE TENSION ADHESION AND THERMAL CONTROL

(71) Applicant: INTERNATIONAL BUSINESS MACHINES CORPORATION, Armonk, NY (US)

(72) Inventors: Luc Guerin, Quebec (CA); Marc D. Knox, Hinesburg, VT (US); George J. Lawson, Barre, VT (US); Van T. Truong, Quebec (CA); Steve Whitehead, Quebec (CA)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/890,776

(22) Filed: May 9, 2013

(65) Prior Publication Data
US 2014/0332810 A1    Nov. 13, 2014

(51) Int. Cl.
*H01L 21/683*    (2006.01)

(52) U.S. Cl.
CPC ..... *H01L 21/6835* (2013.01); *H01L 2221/6834* (2013.01); *H01L 2221/68327* (2013.01); *H01L 2221/68381* (2013.01)

(58) Field of Classification Search
CPC ............ G01R 31/2874; H01L 21/6835; H01L 21/2007; H01L 21/76251; H01L 2221/68327; H01L 2221/6835; H01L 2221/68359; H01L 24/26; H01L 24/83; H01L 2221/6834; H01L 2221/68381
See application file for complete search history.

(56) References Cited

U.S. PATENT DOCUMENTS

| | | | | |
|---|---|---|---|---|
| 3,752,717 | A * | 8/1973 | White | 438/464 |
| 3,864,819 | A * | 2/1975 | Ying | 438/113 |
| 3,970,494 | A * | 7/1976 | Pritchard | 438/464 |
| 5,288,769 | A | 2/1994 | Papageorge et al. | |
| 5,474,458 | A * | 12/1995 | Vafi et al. | 439/91 |
| 5,532,612 | A * | 7/1996 | Liang | 324/750.05 |
| 6,013,534 | A * | 1/2000 | Mountain | 438/15 |
| 6,128,134 | A * | 10/2000 | Feldman et al. | 359/565 |
| 6,430,956 | B1 | 8/2002 | Haas et al. | |
| 6,544,033 | B1 * | 4/2003 | Scudder et al. | 432/53 |

(Continued)

FOREIGN PATENT DOCUMENTS

| | | |
|---|---|---|
| JP | 11297650 | 10/1999 |
| WO | 02093089 | 11/2002 |

(Continued)

OTHER PUBLICATIONS

Marinissen, Testing TSV-Based Three-Dimensional Stacked ICs, 2010, DATE10.*

(Continued)

*Primary Examiner* — Brett Feeney
*Assistant Examiner* — Sophia Nguyen
(74) *Attorney, Agent, or Firm* — Michael LeStrange; Andrew M. Calderon; Roberts Mlotkowski Safran & Cole, P.C.

(57) ABSTRACT

An assembly including a liquid thermal interface material for surface tension adhesion and thermal control used during electrical/thermal test of a 3D wafer and methods of use. The method includes temporarily attaching a thinned wafer to a carrier wafer by applying a non-adhesive material therebetween and pressing the thinned wafer and the blank silicon-based carrier wafer together.

16 Claims, 3 Drawing Sheets

(56) References Cited

U.S. PATENT DOCUMENTS

| | | | |
|---|---|---|---|
| 6,673,434 B2 | 1/2004 | Nguyen | |
| 6,767,765 B2 | 7/2004 | Chiu | |
| 6,822,018 B2 | 11/2004 | Chaudhuri et al. | |
| 7,030,485 B2 | 4/2006 | Houle et al. | |
| 7,115,485 B2 * | 10/2006 | Priewasser | 438/464 |
| 7,169,245 B2 | 1/2007 | Murray et al. | |
| 7,202,111 B2 | 4/2007 | Chiu | |
| 7,264,041 B2 | 9/2007 | Karidis et al. | |
| 7,327,027 B2 | 2/2008 | Houle et al. | |
| 7,331,184 B2 | 2/2008 | Lee | |
| 7,335,578 B2 * | 2/2008 | Fukuoka et al. | 438/464 |
| 7,355,855 B2 | 4/2008 | Karidis et al. | |
| 7,362,582 B2 | 4/2008 | Karidis et al. | |
| 7,408,780 B2 | 8/2008 | Karidis et al. | |
| 7,541,203 B1 * | 6/2009 | Knickerbocker | 438/17 |
| 7,545,648 B2 | 6/2009 | Karidis et al. | |
| 7,567,090 B2 | 7/2009 | Cote et al. | |
| 7,608,324 B2 | 10/2009 | Nguyen et al. | |
| 7,723,160 B2 | 5/2010 | Houle et al. | |
| 7,776,746 B2 * | 8/2010 | Feng et al. | 438/690 |
| 7,808,099 B2 | 10/2010 | Bertrand et al. | |
| 7,838,418 B2 | 11/2010 | Hillman et al. | |
| 7,964,542 B2 | 6/2011 | Sachdev et al. | |
| 8,236,669 B2 | 8/2012 | Hong et al. | |
| 2002/0115263 A1 * | 8/2002 | Worth et al. | 438/455 |
| 2002/0132896 A1 | 9/2002 | Nguyen | |
| 2003/0024250 A1 | 2/2003 | Haas et al. | |
| 2003/0037874 A1 * | 2/2003 | Liau et al. | 156/306.3 |
| 2003/0183909 A1 | 10/2003 | Chiu | |
| 2004/0101782 A1 * | 5/2004 | Gorczyca | 430/290 |
| 2004/0137216 A1 | 7/2004 | Nguyen | |
| 2004/0241912 A1 | 12/2004 | Chiu | |
| 2004/0262743 A1 | 12/2004 | Houle et al. | |
| 2005/0173064 A1 * | 8/2005 | Miyanari | 156/344 |
| 2006/0057346 A1 | 3/2006 | Ito et al. | |
| 2006/0057364 A1 | 3/2006 | Nguyen | |
| 2006/0138644 A1 | 6/2006 | Houle et al. | |
| 2006/0141671 A1 | 6/2006 | Houle et al. | |
| 2006/0278371 A1 | 12/2006 | Karidis et al. | |
| 2006/0279932 A1 | 12/2006 | Karidis et al. | |
| 2006/0279935 A1 | 12/2006 | Karidis et al. | |
| 2006/0279936 A1 | 12/2006 | Karidis et al. | |
| 2007/0056294 A1 | 3/2007 | Lee | |
| 2007/0059864 A1 * | 3/2007 | Huang et al. | 438/118 |
| 2007/0072331 A1 * | 3/2007 | Chilcott | 438/53 |
| 2007/0075421 A1 * | 4/2007 | Kuan et al. | 257/734 |
| 2007/0098971 A1 | 5/2007 | Nguyen et al. | |
| 2007/0135543 A1 | 6/2007 | Yasuda et al. | |
| 2007/0161521 A1 | 7/2007 | Sachdev et al. | |
| 2008/0116921 A1 | 5/2008 | Cote et al. | |
| 2008/0170370 A1 | 7/2008 | Karidis et al. | |
| 2008/0211061 A1 * | 9/2008 | Atwater, Jr. et al. | 257/615 |
| 2008/0298016 A1 | 12/2008 | Karidis et al. | |
| 2009/0145802 A1 | 6/2009 | Hillman et al. | |
| 2009/0146294 A1 | 6/2009 | Hillman et al. | |
| 2009/0149021 A1 | 6/2009 | Hillman et al. | |
| 2009/0201643 A1 * | 8/2009 | Shi et al. | 361/699 |
| 2009/0281254 A1 | 11/2009 | Bertrand et al. | |
| 2010/0163217 A1 | 7/2010 | Stuckey | |
| 2010/0164510 A1 | 7/2010 | Abazarnia et al. | |
| 2010/0200197 A1 | 8/2010 | Bezama et al. | |
| 2010/0326702 A1 * | 12/2010 | Dang et al. | 174/250 |
| 2010/0329213 A1 * | 12/2010 | Hayashi | 370/331 |
| 2011/0048795 A1 | 3/2011 | Cohen et al. | |
| 2011/0156284 A1 * | 6/2011 | Zhang et al. | 257/797 |
| 2011/0232074 A1 * | 9/2011 | Bradl et al. | 29/559 |
| 2011/0253315 A1 * | 10/2011 | George | 156/718 |
| 2011/0267084 A1 * | 11/2011 | Erwin et al. | 324/750.09 |
| 2011/0297300 A1 | 12/2011 | Furuya | |
| 2012/0000613 A1 * | 1/2012 | Thallner | 156/703 |
| 2012/0007626 A1 * | 1/2012 | Eldridge | 324/756.03 |
| 2012/0025846 A1 * | 2/2012 | Minas et al. | 324/606 |
| 2012/0086135 A1 * | 4/2012 | Thompson et al. | 257/787 |
| 2012/0175045 A1 | 7/2012 | Furuya et al. | |
| 2012/0272100 A1 * | 10/2012 | Chase et al. | 714/34 |
| 2013/0032296 A1 * | 2/2013 | Zhong | 156/704 |
| 2013/0154106 A1 * | 6/2013 | Hu et al. | 257/774 |
| 2013/0192754 A1 * | 8/2013 | Dukkipati et al. | 156/308.2 |
| 2013/0297981 A1 * | 11/2013 | Gu et al. | 714/727 |
| 2013/0299953 A1 * | 11/2013 | Hubbard et al. | 257/643 |
| 2013/0329376 A1 * | 12/2013 | Racz et al. | 361/728 |
| 2014/0057450 A1 * | 2/2014 | Bourbina et al. | 438/759 |
| 2014/0141253 A1 * | 5/2014 | Fujii et al. | 428/411.1 |
| 2014/0183740 A1 * | 7/2014 | Li et al. | 257/751 |
| 2014/0322893 A1 * | 10/2014 | Tan et al. | 438/458 |

FOREIGN PATENT DOCUMENTS

| | | |
|---|---|---|
| WO | 02096636 | 12/2002 |
| WO | 03064148 | 7/2003 |
| WO | 2006065346 | 6/2006 |
| WO | 2006129458 | 7/2006 |
| WO | 2009035459 | 3/2009 |

OTHER PUBLICATIONS

Zoschke et al., Polyimide Based Temporary Wafer Bonding Technology for High Temperature Compliant Tsv Backside Processing and Thin Device Handling, 2012, SUSS report.*

Huemoeller, Thin wafer handling challenges, Amkor Technology, 2010.*

* cited by examiner

TEMPORARY LIQUID THERMAL INTERFACE MATERIAL FOR SURFACE TENSION ADHESION AND THERMAL CONTROL

FIELD OF THE INVENTION

The invention relates to semiconductor structures and, more particularly, to an assembly including a temporary liquid thermal interface material for surface tension adhesion and thermal control used during electrical/thermal test of a 3D wafer and methods of use.

BACKGROUND

The advent of 3D Integrated Circuit technology has seen the convergence of particular processing methodologies for fabrication of 3D wafers. For example, a favored method of processing 3D through silicon via (TSV) wafers is to perform wafer thinning and processing of the TSV wafer while mounted to a glass wafer. This glass wafer provides a flat and stable platform which allows wafers to be thinned and processed and handled by existing wafer finishing and processing tools. The thinning and processing of the wafer is necessary to expose the through silicon vias which are only fabricated in approximately the first 60 μm of silicon on the active side of the wafer. Once exposed by a grinding operation (thinning implied), traditional wafer fabrication processes are used to connect to, isolate and passivate the connections and wiring.

For example, a glass carrier wafer onto which the TSV wafer to be thinned is attached with adhesive. The glass allows for the eventual separation of the carrier wafer and the thinned TSV wafer using a laser ablation process. In this process, a laser passes through the transparent glass and the energy is absorbed by the adhesive layer resulting in the ablation (vaporization) of the adhesive at the carrier/adhesive interface thereby releasing the bond of the adhesive. It is desirable to leave the thinned silicon wafer attached to the glass carrier wafer for the remainder of the processing including wafer level testing.

During wafer level testing, the bonded thin wafer and glass carrier wafer act as one mechanical unit and are placed on a wafer chuck and are probed with wafer scale test probes for testing purposes. However, there is a thermal problem associated with the glass carrier wafer which is now interposed between the wafer chuck and the device under test (the TSV wafer or chip site). Specifically, the glass carrier wafer has a thermal conductivity of 1.2 W/mK while a normal full thickness silicon wafer has a conductivity of 149 W/mK. This translates to a thermal resistance which is 100× worse with the glass. For any testing that requires high power (e.g., processors, dense logic, etc.), the temperature rise of the silicon under test becomes prohibitive. The glass carrier wafer is essentially a thermal insulator and, as a result, the temperature of a 3D wafer cannot be controlled during test, thereby preventing proper performance testing and also putting the device under test at risk. The risk is of self destruction of the device under test and/or of the probe assembly.

Accordingly, there exists a need in the art to overcome the deficiencies and limitations described hereinabove.

SUMMARY

In an aspect of the invention, a method comprises temporarily attaching a thinned wafer to a carrier wafer by applying a non-adhesive material therebetween and pressing the thinned wafer and the blank carrier wafer together.

In an aspect of the invention, a method comprises: applying an alkane liquid film to at least one of a wafer and a carrier wafer; pressing together the wafer and the carrier wafer such that the alkane liquid film provides cohesion to join together the wafer and the carrier wafer; and removing the wafer from the silicon-based carrier wafer by a thermal baking process after testing of active portions of the wafer.

In an aspect of the invention, an assembly under test comprises an alkane liquid film temporarily coupling a thinned wafer with through silicon vias to a blank, unprocessed silicon based wafer.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the assembly under test, which comprises the structures of the present invention. In still further embodiments, a method in a computer-aided design system is provided for generating a functional design model of the assembly under test. The method comprises generating a functional representation of the structural elements of the assembly under test.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to an assembly including a temporary liquid thermal interface material for surface tension adhesion and thermal control used during electrical/thermal test of a 3D wafer and methods of use. More specifically, the present invention provides a solution that supports thermal control of a 3D device under test during wafer-level testing to protect investment in probes and also protect against yield loss associated with over-current conditions and/or thermal runaway conditions that would pose a long-term reliability risk to the device. That is, the present invention eliminates the need for a glass carrier wafer during testing and other process, which is essentially a thermal insulator. By eliminating the glass carrier and using a blank, unprocessed silicon-based wafer, for example, the temperature of a 3D wafer can be controlled during test, thereby ensuring proper performance testing and also reducing any risk to the device, e.g., self destruction of the device under test and/or of the probe assembly.

Advantageously, the present invention provides:
  the ability to provide a temporary attachment of a carrier wafer and thinned wafer under test (removable);

a thermally conductive path to a wafer chuck (on the order of a full thickness silicon wafer);

a mechanically flat and stable base for the thinned wafer under test;

a carrier wafer with thermal coefficient of expansion (TCE) that is closely matched to the wafer under test;

a base which allows handling and manipulation using existing wafer handling/probing equipment; and compatibility with downstream processing such as wafer dicing and wafer sort and pick tooling.

Figure 1:
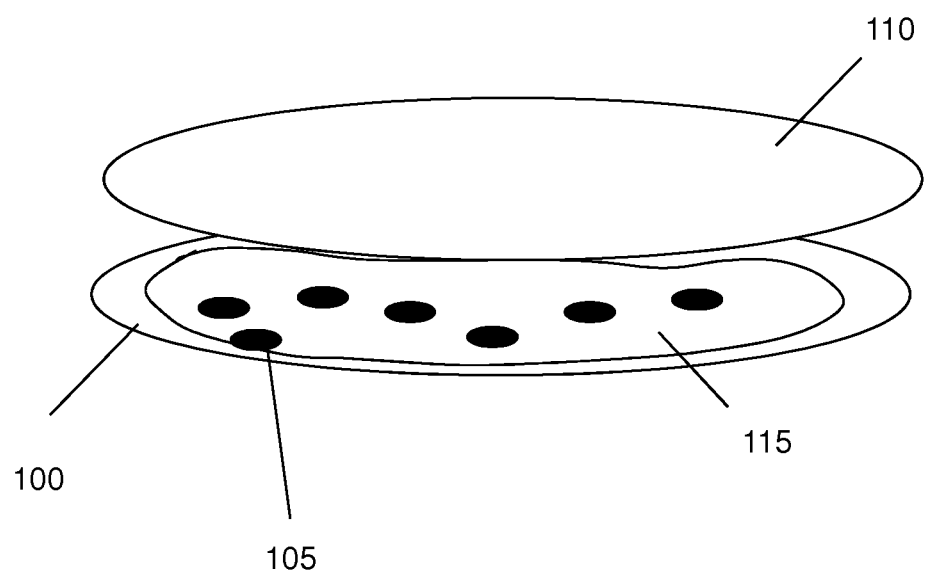
FIG. 1 shows an exploded view of an assembly in accordance with aspects of the present invention.

FIG. 1 shows an exploded view of an assembly in accordance with aspects of the present invention, e.g., a wafer under test. More specifically, FIG. 1 shows a thinned wafer 100 attached to a carrier wafer 110. In embodiments, the thinned wafer 100 includes, for example, through silicon vias 105 formed by conventional lithography, etching and deposition of material within vias, followed by a thinning of the wafer to expose a backside of the filled vias 105. In embodiments, the thinning can be performed in any conventional manner, e.g., bonding the wafer 100 to a glass substrate and performing a grinding technique, as is known to those of skill in the art.

Still referring to FIG. 1, the carrier wafer 110 can be any thermally conductive material. In embodiments, the carrier wafer 110 can be any carrier material that is suitable for both the processing required (test or other) and is compatible with the bonding material, as discussed herein, e.g., is flat and stable and inert, etc. In embodiments, the present invention contemplates the use of a standard unprocessed blank silicon-based wafer of full thickness (approximately 780 μm). The silicon carrier wafer 110 provides the structural support required for a 3D wafer for automated wafer handling mechanisms on wafer-level processing tools after the 3D wafer has been thinned/bumped. The carrier wafer 110 also provides structural support for a 3D wafer in site-to-site wafer-level shipping containers as well as in-house wafer-level transport containers.

In embodiments, the thinned wafer 100 is attached to the silicon carrier wafer 110 of full thickness, using a material (liquid film) 115. For example, in the assembly, the liquid film 115 is dispensed on the surface of the wafer 100 and/or the silicon carrier wafer 110 such that the liquid film 115 provides surface tension for the purpose of cohesion between the two wafers to keep them joined together. In embodiments, the liquid film 115 is an alkane with 5-20 carbon atoms, with a preferred material of Pentadecane. In embodiments, the material provides the following advantageous properties, amongst others:

the material 115 is non-adhesive; that is, the material is not a paste/glue/epoxy based material that would require additional processing steps to remove it after wafer-level processing is complete;

the material 115 does not require cleaning and leaves no post-processing residue; that is, the material 115 does not leave a residue that would require additional cleaning steps to ensure device attachment at the next level of assembly;

the material 115 is electrically non-conductive and can be used during device electrical test without risk of shorting power, ground or I/O connections together;

the material 115 is thermally conductive, thus enabling adequate thermal control of a device under test, particularly enabling testing of semiconductor devices at powers in excess of 40 watts;

the material 115 is non-corrosive and has no adverse affect/degradation of traditional semiconductor materials, thus allowing contact with the wafer and C4 fabrication materials without risk of C4 corrosion or passivation attack that would present long term reliability exposure;

the material 115 has good surface wettability;

the material 115 enables automatic wafer handling in process tools by virtue of the surface tension, e.g., in the range of about 25-30 dyn/cm, created between the carrier wafer and the 3D thinned wafer;

the material 115 has a low boiling temperature which yields a fairly rapid evaporation rate, e.g., boiling points of pentane isomers can be about 120° C.; and the material 115 is thermally stable at temperatures up to about 120° C., in conjunction with the silicon carrier wafer 110. In this way, the material 115 enables device testing at temperatures above ambient by ensuring thermal control of the device under test to guard against undesirable conditions (over-current/thermal runaway, etc.).

In embodiments, by using the combination of the carrier wafer 110 and the material 115, it is now possible to provide the necessary thermal transfer during testing of a 3D device so that as the current/power increases, the device temperature can be controlled by changing the temperature of a chuck that the silicon carrier/3D wafer stack is situated on. Also, in embodiments, the 3D wafer 100 can now be held in place on the carrier wafer 110 during transport between wafer-level process operations and during the wafer test process as a result of the surface tension provided by the preferred material. Also, by implementing the use of the material 115 and the carrier wafer 110 (e.g., unprocessed blank silicon wafer of full thickness), it is now possible to incorporate structural support and the ability to control temperature during one or more wafer test process steps.

Figure 2:
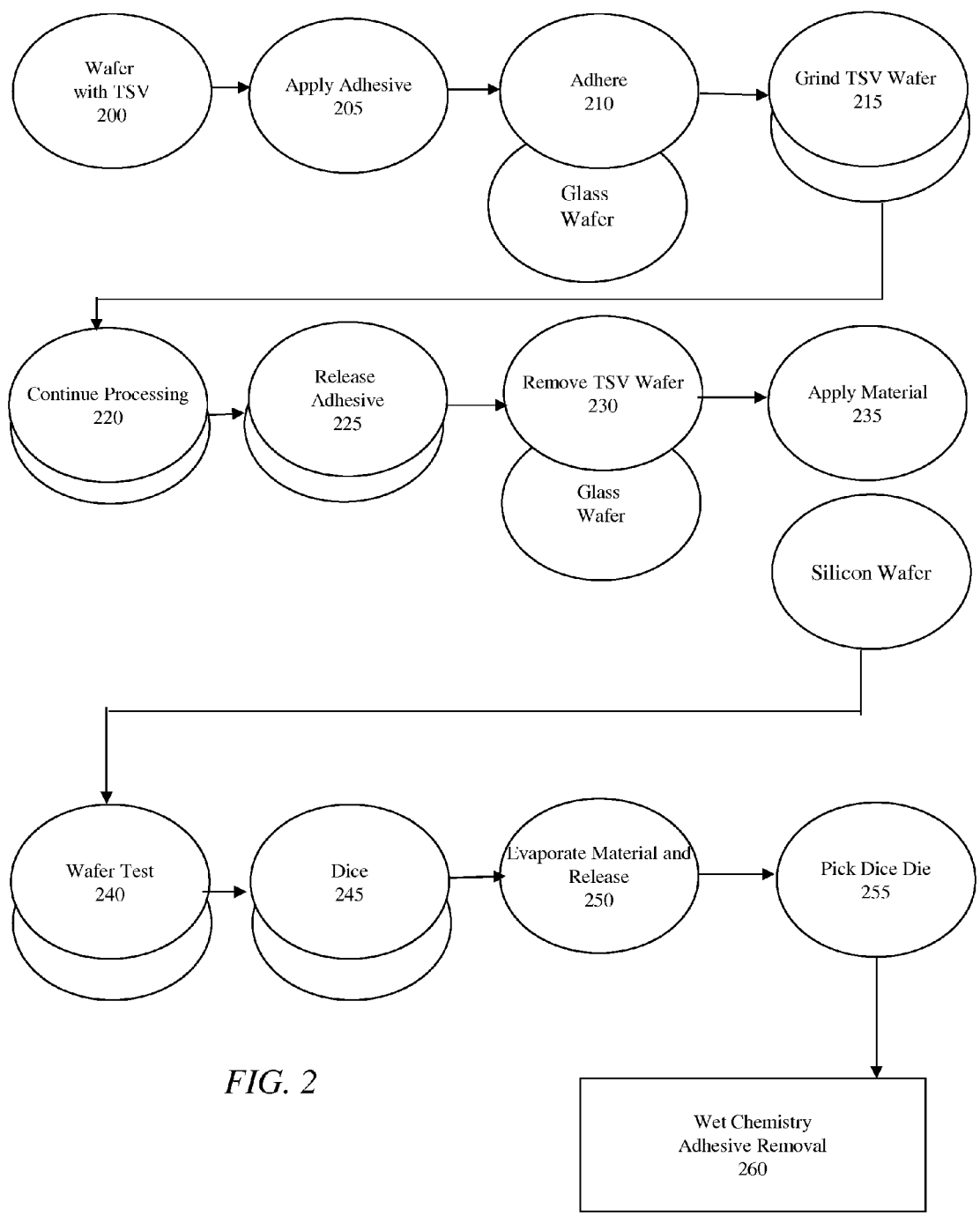
FIG. 2 shows a graphical flow diagram implementing steps of forming the assembly in accordance with aspects of the present invention.

FIG. 2 shows a graphical flow diagram implementing steps of forming the assembly in accordance with aspects of the present invention. At step 200, a wafer with filled vias is provided, front side up. At step 205, an adhesive is applied to the front side of the wafer. At step 210, the wafer is adhered to a glass substrate. At step 215, the wafer is subjected to grinding and/or thinning to expose the filled vias. This process forms through silicon vias (TSV). At step 220, additional processing is provided on the wafer including, for example, adding metals, passivation layers and solder bumps (C4 bumps). At step 225, the thinned wafer is released from the glass substrate using, for example, laser ablation techniques, and, at step 230, the thinned wafer is removed from the glass substrate.

At step 235, the liquid film of the present invention is applied to (dispensed on) the surface of the carrier wafer, and the carrier wafer is then attached to the thinned wafer. Alternatively, the liquid film can be applied to (dispensed on) the thinned wafer or both the thinned wafer and the carrier wafer (e.g., blank silicon-based carrier wafer). For example, application of the liquid film can be provided by placing the carrier wafer on a flat surface and dispensing the liquid film thereon using conventional application methods, e.g., doctor's blade, syringe, nozzle, spray of other dispensing mechanism. In embodiments, the entire surface of the carrier wafer (and hence thinned wafer) should be covered with the liquid film. The thinned wafer is placed on top of the carrier wafer, and the two wafers are pressed together to eliminate any air bubbles, to distribute the material and bring the two wafers into intimate contact. In embodiments, a compliant roller can be used to press the wafers together, under for example, a few pounds (e.g., about 3-5 pounds) of force. In this way, it is possible to provide a temporary yet robust attachment of a carrier wafer to the thinned wafer through the utilization of a thin film of liquid which keeps the two wafers (thin and carrier) in intimate contact utilizing the surface tension of the liquid on the wafers.

The completed joined wafer pair is placed in a conventional wafer transportation unit and proceeds to the next processing step, e.g., wafer mapping or wafer test. For example, at step 240, the thinned wafer undergoes wafer testing, e.g., a probe is placed in contact with the TSV on a groundside of the thinned wafer. At step 245, after the wafers are tested, the joined wafers can be sent to multiple different back end of the line processes, such as, for example, a laser dicing operation. In embodiments, the laser dicing operation can be performed on the thinned wafer while still joined to the carrier wafer (which remains undiced). In this way, the diced dies remain on the undiced carrier wafer and are held in place by the surface tension of the liquid film.

At step 245, the diced dies, e.g., chips, are separated from the carrier wafer using a bake procedure. For example, the bake can be performed in a standard oven at temperatures that allow the liquid to evaporate, e.g., approximately 135° C. This bake procedure will release the diced/thinned die to facilitate removal of the thinned die during the picking operation. At step 255, the diced dies are then picked from the wafer carrier. At step 260, the diced dies are processed through a cleaning operation to remove the adhesive used to attach the wafer to the glass carrier prior to the grind process.

Figure 3:
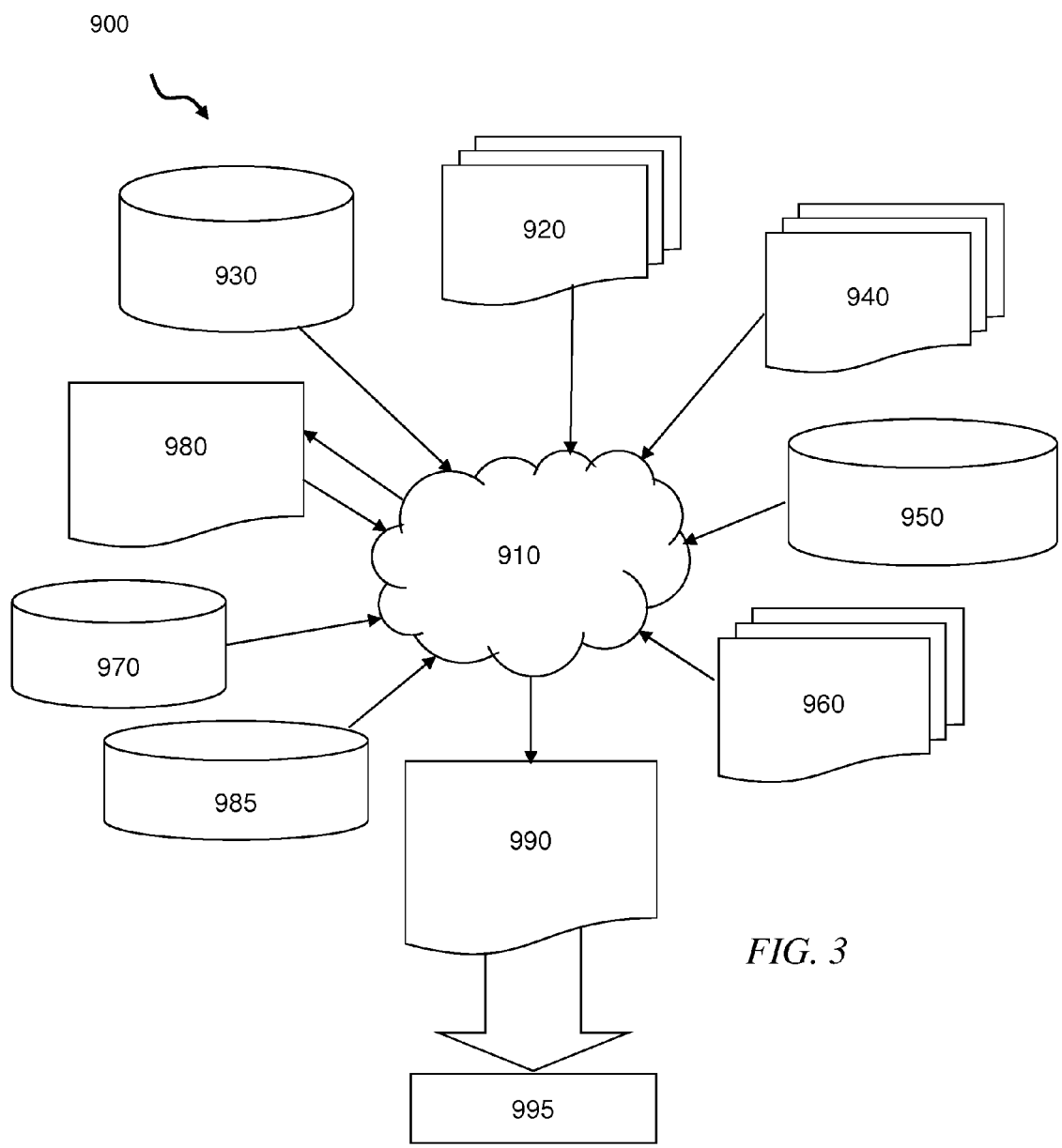
FIG. 3 is a flow diagram of a design process used in semiconductor design, manufacture, and/or test.

FIG. 3 is a flow diagram of a design process used in semiconductor design, manufacture, and/or test. FIG. 3 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1 and 2. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 3 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1 and 2. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1 and 2 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 and 2. In one embodiment, design structure 990 may comprise a compiled, executable HDL simulation model that functionally simulates the devices shown in FIGS. 1 and 2.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1 and 2. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method of testing a three-dimensional device, comprising:
    temporarily adhering a wafer to a glass substrate with an adhesive;
    thinning the wafer to form a thinned wafer; and
    temporarily attaching the thinned wafer to a carrier wafer by applying a non-adhesive material therebetween and pressing the thinned wafer and the carrier wafer together,
    wherein the non-adhesive material is applied after the adhesive material,
    wherein the thinned wafer is detached from the glass substrate prior to temporarily attaching the thinned wafer to the carrier wafer, and
    wherein the carrier wafer is an unprocessed silicon wafer,
    wherein the thinning the wafer to form the thinned wafer forms a through silicon via (TSV) in the thinned wafer, and further comprising:
    testing the thinned wafer by contacting the TSV while the thinned wafer is attached to the carrier wafer;
    dicing the thinned wafer while the thinned wafer is attached to the carrier wafer and without dicing the carrier wafer, wherein the dicing forms diced dies;
    releasing the diced dies from the carrier wafer using a bake procedure that evaporates the non-adhesive material;
    picking the diced dies from the carrier wafer; and
    removing the adhesive material the diced dies.

2. The method of claim 1, wherein the material is a liquid film which is electrically non-conductive and thermally conductive to provide thermal control during an electrical test of the thinned wafer.

3. The method of claim 1, wherein the material is an alkane.

4. The method of claim 3, wherein the alkane has 5 to 20 carbon atoms.

5. The method of claim 3, wherein the alkane is Pentadecane.

6. The method of claim 3, wherein the alkane provides a surface tension in a range of about 25-30 dyn/cm.

7. The method of claim 3, wherein the alkane provides thermal transfer between the thinned wafer and the carrier wafer, enabling testing of devices at powers in excess of 40 watts.

8. The method of claim 1, further comprising processing the thinned wafer while attached to the carrier wafer.

9. The method of claim 1, wherein the material is a liquid film dispensed on a surface of at least one of the thinned wafer and the silicon-based wafer such that the liquid film provides surface tension for the purpose of cohesion between the thinned wafer and the carrier wafer to keep them joined together during testing.

10. The method of claim 1, wherein an active side of the thinned wafer is placed in contact with the carrier wafer.

11. A method of testing a three-dimensional device, comprising:
    applying an adhesive material to a wafer to adhere the wafer to a glass substrate;
    processing the wafer into a thinned wafer;
    applying an alkane liquid film to at least one of the thinned wafer and a carrier wafer, wherein the alkane liquid film is applied after applying the adhesive material; and pressing together the thinned wafer and the carrier wafer such that the alkane liquid film provides cohesion to join together the thinned wafer and the carrier wafer, wherein the thinned wafer is detached from the glass substrate prior to applying the alkane liquid film to the at least one of the thinned wafer and the carrier wafer, and wherein the carrier wafer is an unprocessed blank silicon wafer, wherein the processing the wafer into the thinned wafer forms a through silicon via (TSV) in the thinned wafer, and further comprises:

testing the thinned wafer by contacting the TSV while the thinned wafer is attached to the carrier wafer;

dicing the thinned wafer while the thinned wafer is attached to the carrier wafer and without dicing the carrier wafer, wherein the dicing forms diced dies;

releasing the diced dies from the carrier wafer using a thermal baking process that evaporates the alkane liquid film;

picking the diced dies from the carrier wafer; and removing the adhesive material from the diced dies.

12. The method of claim 11, wherein the alkane comprises 5 to 20 carbon atoms.

13. The method of claim 11, wherein the alkane is pentadecane.

14. The method of claim 11, wherein the alkane is electrically non-conductive and thermally conductive in order to provide thermal control during an electrical test of the thinned wafer.

15. The method of claim 11, wherein the pressing removes air bubbles from between the thinned wafer and the carrier wafer.

16. The method of claim 11, wherein the releasing the diced dies is performed after the dicing of the thinned wafer.

* * * * *